(12) United States Patent
Esler et al.

(10) Patent No.: US 11,289,444 B2
(45) Date of Patent: Mar. 29, 2022

(54) SENSOR SYSTEMS AND METHODS FOR PROVIDING SENSOR SYSTEMS

(71) Applicant: General Electric Company, Schenectady, NY (US)

(72) Inventors: David Richard Esler, Gloversville, NY (US); Nancy Cecelia Stoffel, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 32 days.

(21) Appl. No.: 16/713,437

(22) Filed: Dec. 13, 2019

(65) Prior Publication Data
US 2021/0183808 A1    Jun. 17, 2021

(51) Int. Cl.
*H01L 23/00* (2006.01)
*H01L 41/047* (2006.01)
*B81B 7/00* (2006.01)
*B81C 1/00* (2006.01)

(52) U.S. Cl.
CPC ............ *H01L 24/73* (2013.01); *B81B 7/0006* (2013.01); *H01L 24/05* (2013.01); *H01L 24/08* (2013.01); *H01L 24/11* (2013.01); *H01L 24/13* (2013.01); *H01L 24/32* (2013.01); *H01L 24/92* (2013.01); *H01L 41/0475* (2013.01);
(Continued)

(58) Field of Classification Search
CPC ....... B81C 1/00301; H01L 2224/73204; H01L 2224/13144; H01L 24/32; H01L 2224/16227; H01L 2224/05124; H01L 41/0475; H01L 2224/05686; H01L 2224/9211; H01L 2224/32227; H01L 24/05; H01L 24/11; H01L 24/73; H01L 24/13; H01L 2224/73104; H01L 24/08; B81B 2207/098; B81B 7/0006; B81B 7/007
See application file for complete search history.

(56) References Cited

U.S. PATENT DOCUMENTS 5,945,605 A * 8/1999 Julian ................. G01L 19/0627
                                                      73/727
6,078,229 A    6/2000  Funada et al.
7,451,651 B2  11/2008  Woychik et al.
9,885,865 B2   2/2018  Ishii
(Continued)

FOREIGN PATENT DOCUMENTS

CN    204675827 U    9/2015
JP    2014050894 A   3/2014

OTHER PUBLICATIONS

Pai et al., "The Viability of Anisotropic Conductive Film as a Flip Chip Interconnect Technology for MEMS Devices", Journal of Micromechanics and Micro engineering, vol. 15, Issue No. 06, Apr. 22, 2005.

(Continued)

*Primary Examiner* — Jasmine J Clark
(74) *Attorney, Agent, or Firm* — Dority & Manning, P.A.

(57) ABSTRACT

A sensor assembly includes a die substrate and a metalized layer formed on the die substrate. The metalized layer is formed of a first metal material and includes a bonding pad to facilitate electrically coupling the sensor assembly to a sensor system. A remetalized bump is formed on the bonding pad of a second metal material and is electrically coupled to the metalized layer. An adhesive is applied to the remetalized bump and facilitates mechanically coupling the sensor assembly to the sensor system.

20 Claims, 8 Drawing Sheets

(52) U.S. Cl.
CPC ..... *B81B 2207/098* (2013.01); *B81C 1/00301* (2013.01); *B81C 2203/032* (2013.01); *H01L 2224/05124* (2013.01); *H01L 2224/05686* (2013.01); *H01L 2224/13124* (2013.01); *H01L 2224/13144* (2013.01); *H01L 2224/13147* (2013.01); *H01L 2224/13164* (2013.01); *H01L 2224/13169* (2013.01); *H01L 2224/16157* (2013.01); *H01L 2224/16227* (2013.01); *H01L 2224/32157* (2013.01); *H01L 2224/32227* (2013.01); *H01L 2224/73104* (2013.01); *H01L 2224/73204* (2013.01); *H01L 2224/9211* (2013.01)

(56) References Cited

U.S. PATENT DOCUMENTS

| | | |
|---|---|---|
| 2007/0284681 A1 | 12/2007 | Massieu |
| 2009/0321110 A1 | 12/2009 | Huang et al. |
| 2011/0036174 A1* | 2/2011 | Hooper ................. B81B 7/0061 73/721 |
| 2017/0144438 A1 | 5/2017 | Hayakawa et al. |

OTHER PUBLICATIONS

Kim et al., "High Productivity and Damage-Free Ultrasonic Anisotropic Conductive Film (ACF) Bonding for Touch Screen Panel (TSP) Assemblies", 2012 IEEE 62nd Electronic Components and Technology Conference, pp. 1770-1773, San Diego, CA, USA, Jul. 30, 2012.

* cited by examiner

SENSOR SYSTEMS AND METHODS FOR PROVIDING SENSOR SYSTEMS

STATEMENT REGARDING FEDERALLY SPONSORED RESEARCH & DEVELOPMENT

This invention was made with government support under U.S. Government Contract Number: FA8650-15-2-5401 awarded by the United States Air Force Research Laboratory. The government has certain rights in the invention.

BACKGROUND

The field of the disclosure relates generally to sensor systems and, more particularly, to sensor assemblies for use in sensor systems.

At least some known sensor systems include a sensor assembly electrically coupled to an electronics board (e.g., a circuit board which can be rigid or flexible). For example, at least some sensor assemblies are connected to an electronics board using a wire bond, in which a wire may be ultrasonically bonded to connectors on the sensor assembly and the electronics board. At least some such systems result in a loose wire extending between the sensor assemblies and the electronics boards. Thus, at least some known sensor systems increase the overall size of the interconnect to allow space for the loose wire used in the wire bond and, as a result, are not well suited for flat assembly applications where it may be desirable to have a relatively small interconnect. Moreover, it is generally difficult to secure such sensor assemblies to the electronics boards without disturbing the connection of the wire bond. In addition, inductance of the interconnect scales with changes in the length of a wire bond. As a result, shortened interconnections often result in lower inductance interconnects.

Furthermore, at least some known sensor systems include electronics boards having metal traces that are formed of a different metal material than the metal used in the corresponding sensor assemblies. For example, at least some known electronics boards include traces that are formed of a material having a high susceptibility to galvanic corrosion when in contact with the corresponding metal used in sensor assemblies. As a result, at least some known sensor systems are susceptible to degradation at the interconnects between sensor assemblies and electronics boards.

Accordingly, it would be desirable to provide a sensor system that allows for simpler, more robust, and more durable connection between the sensor assembly and an electronics board.

BRIEF DESCRIPTION

In one aspect, a sensor assembly is provided. The sensor assembly includes a die substrate and a metalized layer formed on the die substrate. The metalized layer is formed of a first metal material and includes a bonding pad to facilitate electrically coupling the sensor assembly to a sensor system. A remetalized bump is formed on the bonding pad of a second metal material and is electrically coupled to the metalized layer. An adhesive is applied to the remetalized and facilitates mechanically coupling the sensor assembly to the sensor system.

In another aspect, a sensor system is provided. The sensor system includes an electronics board including a dielectric substrate and a conductive trace coupled to the dielectric substrate. A sensor assembly is coupled to the electronics board, and includes a die substrate and a metalized layer formed on the die substrate. The metalized layer is formed of a first metal material and includes a bonding pad to facilitate electrically coupling the sensor assembly to the trace. A remetalized bump is formed on the bonding pad of a second metal material and electrically couples the bonding pad to the trace. An adhesive is applied to the remetalized bump and facilitates mechanically coupling the sensor assembly to the electronics board.

In another aspect, a method of assembling a sensor system is provided. The method includes forming a metalized layer on a die substrate of a sensor assembly. The metalized layer is formed of a first metal material and includes a bonding pad. The method further includes forming a remetalized bump on the bonding pad, the remetalized bump being formed of a second metal material. The method also includes applying an adhesive to the remetalized bump and coupling the sensor assembly to an electronics board. The electronics board includes a dielectric substrate and a conductive trace coupled to the dielectric substrate. The remetalized bump electrically couples the trace to the bonding pad.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments described herein relate to sensor systems, sensor assemblies for sensor systems, and methods of assembling sensor systems. The sensor system includes an electronics board including a dielectric substrate and a trace. A sensor assembly is coupled to the electronics board and includes a die substrate and a metalized layer formed of a first metal material and including a bonding pad. A remetalized bump is formed on the bonding pad of a second metal material and electrically couples the bonding pad to the trace and an adhesive is applied to the remetalized bump to facilitate mechanically coupling the sensor assembly to the sensor system. As a result, the sensor systems described herein provide for stronger more durable interconnects (e.g., in extreme temperatures and humidity) between sensor assemblies and electronics boards. In addition, the sensor systems described herein allow for reduced spatial requirements for electrically coupling the sensor assemblies to the electronics boards.

Figure 1:
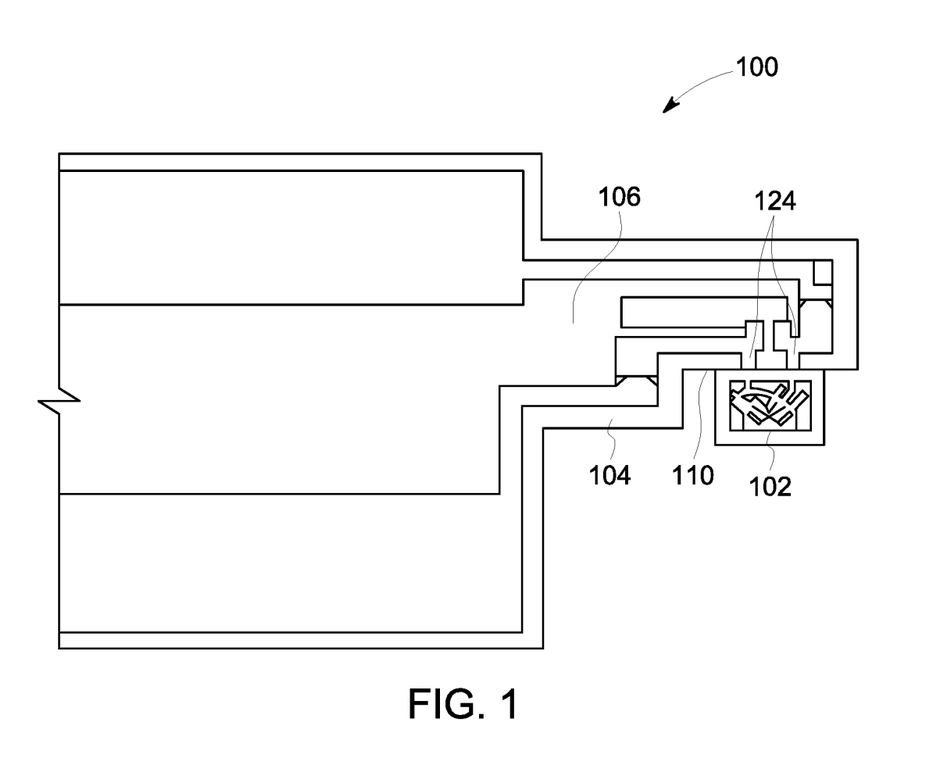
FIG. 1 is a schematic view of an exemplary sensor system including a sensor assembly coupled to an electronics board.

FIG. 1 is a schematic view of an exemplary sensor system 100 including a sensor assembly 102 coupled to an electronics board 104. In the exemplary embodiment, electronics board 104 includes a dielectric substrate 106 and conductive traces 124. In the exemplary embodiment dielectric substrate 106 is a flexible substrate. In alternative embodiments, dielectric substrate 106 is formed of any material that enables sensor system 100 to function as described herein.

Figure 10:
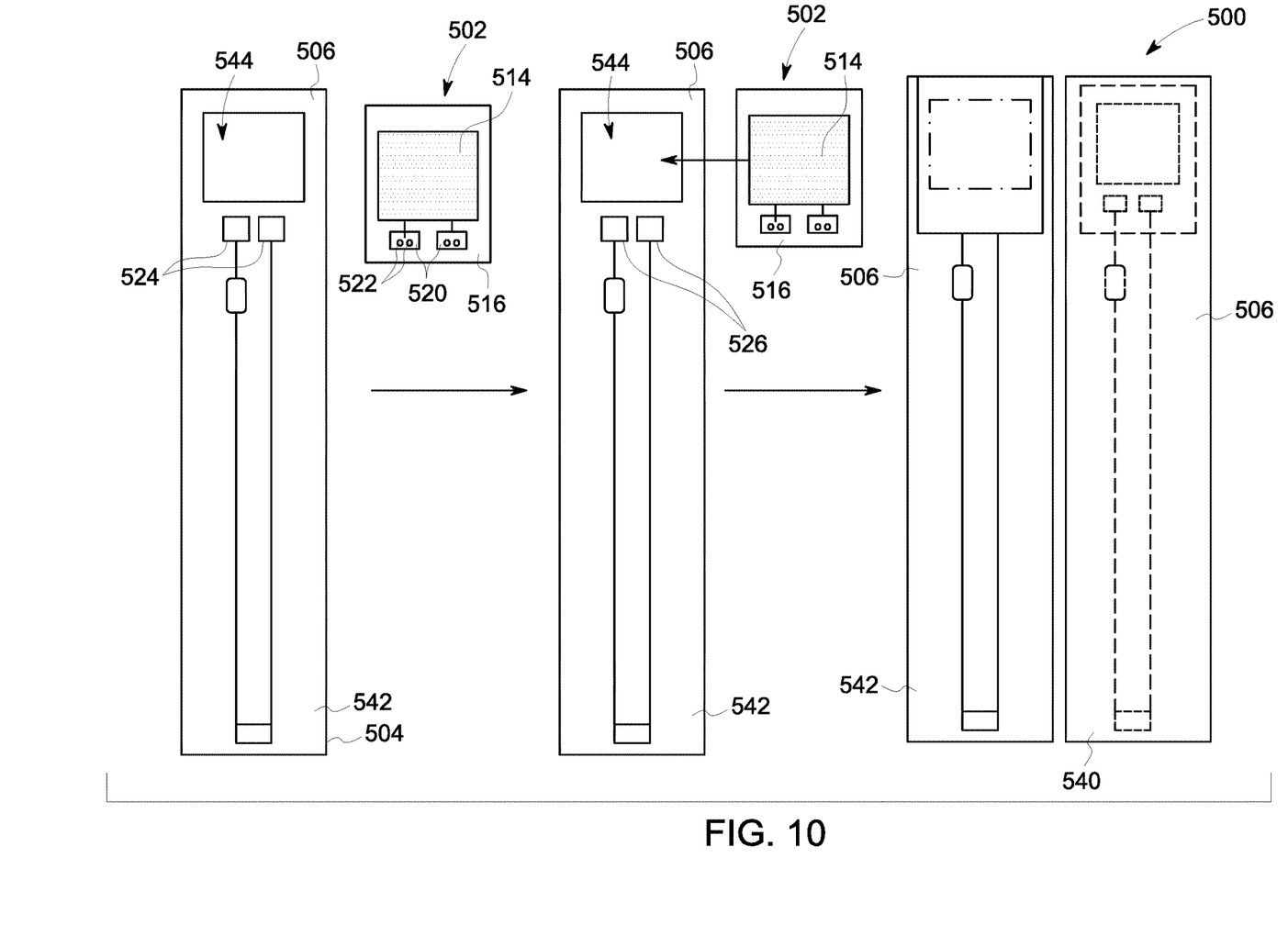
FIG. 10 is a flow diagram of an exemplary production system for assembling an alternative sensor system.

In the exemplary embodiment, sensor assembly 102 is electrically coupled to electronics board 104 to facilitate electrical communication between sensor assembly 102 and various electronics (not shown) of electronics board 104. Sensor assembly 102 is also mechanically coupled to electronics board 104 at a side edge 110 of electronics board 104. In particular, and as described in greater detail below, in the exemplary embodiment sensor assembly 102 is adhered to electronics board 104. In an alternative embodiment, sensor assembly 102 is mechanically coupled to electronics board 104 in any manner that enables sensor system 100 to function as described herein. For example, and without limitation, in some alternative embodiments electronics board 104 defines an aperture 544 (e.g., as shown in FIG. 10) and sensor assembly 102 is coupled to electronics board 104 such that sensor assembly 102 is at least partially received within aperture 544.

Figure 2:
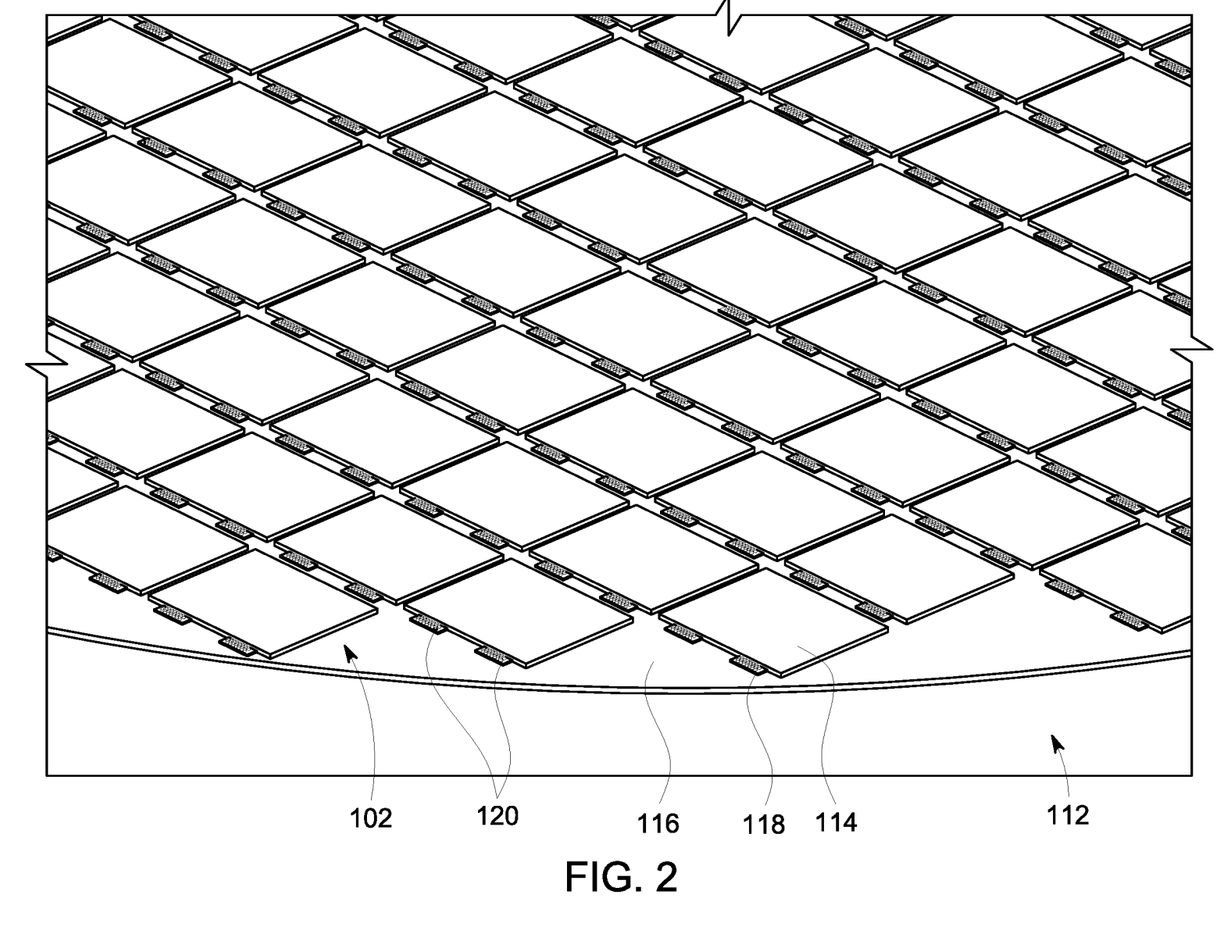
FIG. 2 is a schematic, perspective view of a portion of an exemplary wafer assembly including a plurality of sensor assemblies for use in the sensor system shown in FIG. 1.
Figure 3:
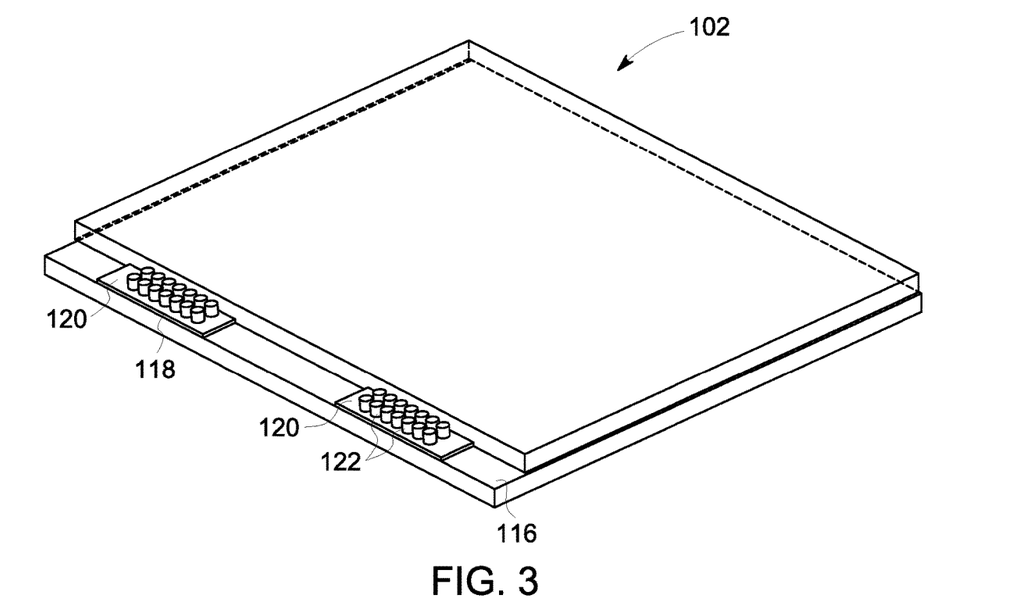
FIG. 3 is schematic, perspective view of an exemplary sensor assembly for use in the sensor system shown in FIG. 1.

FIG. 2 is a schematic, perspective view of a portion of an exemplary wafer assembly 112 including a plurality of sensor assemblies 102 for use in sensor system 100 shown in FIG. 1. FIG. 3 is a schematic, perspective view of an exemplary sensor assembly 102 for use in sensor system 100 shown in FIG. 1. Referring to FIG. 2, in the exemplary embodiment, sensor assemblies 102 each include a lid 114 coupled to a die substrate 116, and a metalized layer 118 formed on die substrate 116. Metalized layer 118 includes a pair of bonding pads 120, exposed by lids 114 and coupled to die substrate 116. More specifically, during production of wafer assembly 112, after formation of die substrate 116, a metallization process is performed to deposit metalized layer 118 on die substrate 116. In the exemplary embodiment, metalized layer 118 extends from bonding pads 120 and under lid 114 such that lid 114 substantially covers metalized layer 118 while exposing bonding pads 120. In alternative embodiments, sensor assemblies 102 do not include lids 114.

Referring to FIG. 3, in the exemplary embodiment, wafer assembly 112 (shown in FIG. 2) undergoes a singulation process (i.e., dicing of wafer assembly 112) to form individual sensor assemblies, for example sensor assembly 102. In the exemplary embodiment, once singulated, metalized layer 118 and die substrate 116 form a microelectromechanical system (MEMS) sensor. More specifically, in the exemplary embodiment, sensor assembly 102 is a surface acoustic wave (SAW) sensor and, in particular, an all-quartz-package sensor, i.e., a sensor sealed between a quartz substrate and a second quartz layer. In alternative embodiments, die substrate 116 is formed of any material that enables sensor assembly 102 to function as described herein. For example, and without limitation, in some alternative embodiments, die substrate 116 is formed of silicon. In the exemplary embodiment, sensor assembly 102 includes a piezoelectric substrate (not shown), a first interdigitated transducer (IDT) (not shown) coupled to the piezoelectric substrate, and a second IDT (not shown) coupled to the piezoelectric substrate and separated from the first IDT by a delay line region (not shown). The first IDT receives an electrical input signal and produces an acoustic wave, e.g., a surface mechanical wave. The second IDT converts the acoustic wave to an electrical output signal through the piezoelectric effect. In alternative embodiments, sensor assembly 102 is any microelectromechanical system (MEMS) sensor that enables sensor system 100, shown in FIG. 1, to function as described herein.

In the exemplary embodiment, a plurality of remetalized bumps 122 are formed on each bonding pad 120 of sensor assembly 102. Remetalized bumps 122 are fixedly coupled to bonding pads 120 and extend outward therefrom. As described in greater detail below, remetalized bumps 122 facilitate electrical flow from metalized layer 118 and, more specifically, bonding pads 120, through remetalized bumps 122. In the exemplary embodiment, remetalized bumps 122 extend substantially the same height from bonding pads 120 to provide a consistent bondline thickness when sensor assembly 102 is coupled to electronics board 104 (shown in FIG. 1). In the exemplary embodiment, fourteen remetalized bumps 122 are formed on each bonding pad 120, positioned in two linearly extending rows of seven remetalized bumps 122. In alternative embodiments, any number of remetalized bumps 122 are formed on bonding pads 120 that enables sensor assembly 102 to function as described herein. For example, and without limitation, in some alternative embodiments, a single remetalized bump 122 is formed on each bonding pad 120.

In the exemplary embodiment, remetalized bumps 122 are formed on bonding pads 120 prior to singulation of wafer assembly 112, shown in FIG. 2, into individual sensor assemblies 102, as shown in FIG. 3. More specifically, remetalized bumps 122 are deposited on bonding pads 120 according to a similar metallization process used to deposit metalized layer 118 on die substrate 116, such as, for example and without limitation, studbumping, use of a wedge wirebonder, electrolytic deposition, electroless deposition, and conductive ball deposition. In alternative embodiments, remetalized bumps 122 are formed on bonding pads 120 subsequent to singulation of wafer assembly 112, shown in FIG. 2. In yet further alternative embodiments, remetalized bumps 122 are formed on bonding pads 120 in any manner that enables remetalized bumps 122 to function as described herein. For example, and without limitation, in some alternative embodiments, remetalized bumps 122 are formed by depositing carbon ink on bonding pads 120.

In the exemplary embodiment, remetalized bumps 122 are substantially cylindrical and extend transversely from bonding pads 120. More specifically, in the exemplary embodiment, remetalized bumps 122 extend between 25 microns to 200 microns in height from bonding pads 120. In alternative embodiments, remetalized bumps 122 are sized and shaped in any manner that enables remetalized bumps 122 to function as described herein. For example, and without limitation, in some alternative embodiments, remetalized bumps 122 each include a plurality of remetalized bumps 122 vertically stacked on one another.

Figure 4:
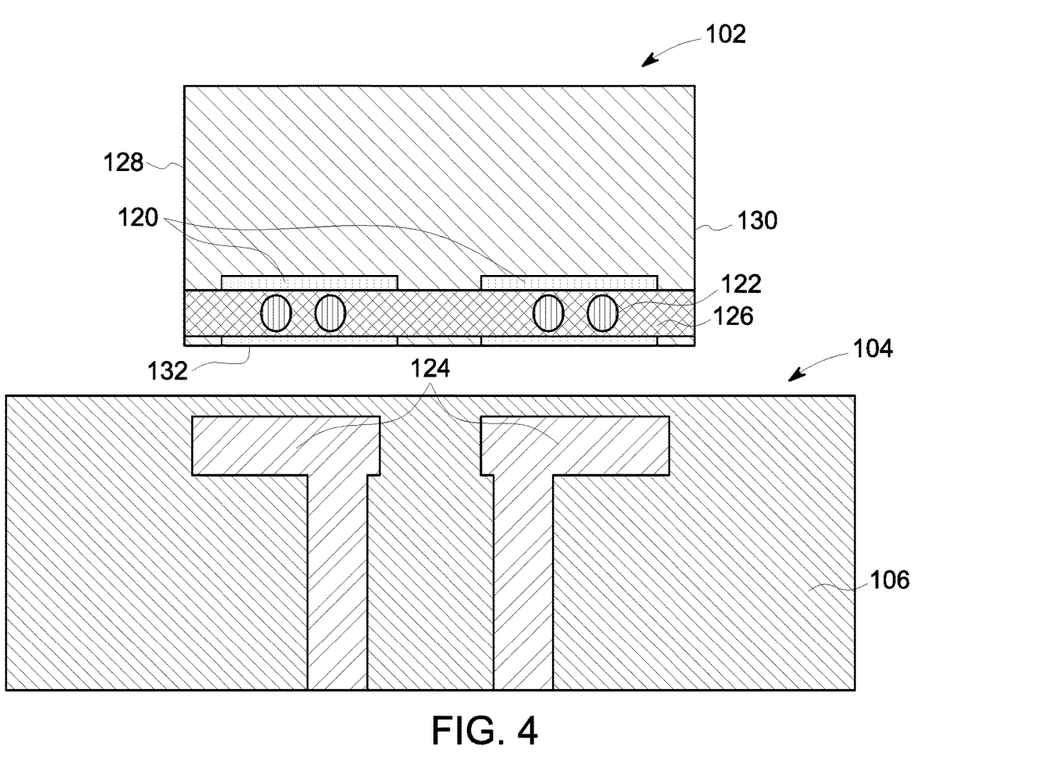
FIG. 4 is a schematic, top view of a portion of an exemplary sensor assembly and electronics board for use in the sensor system shown in FIG. 1.
Figure 5:
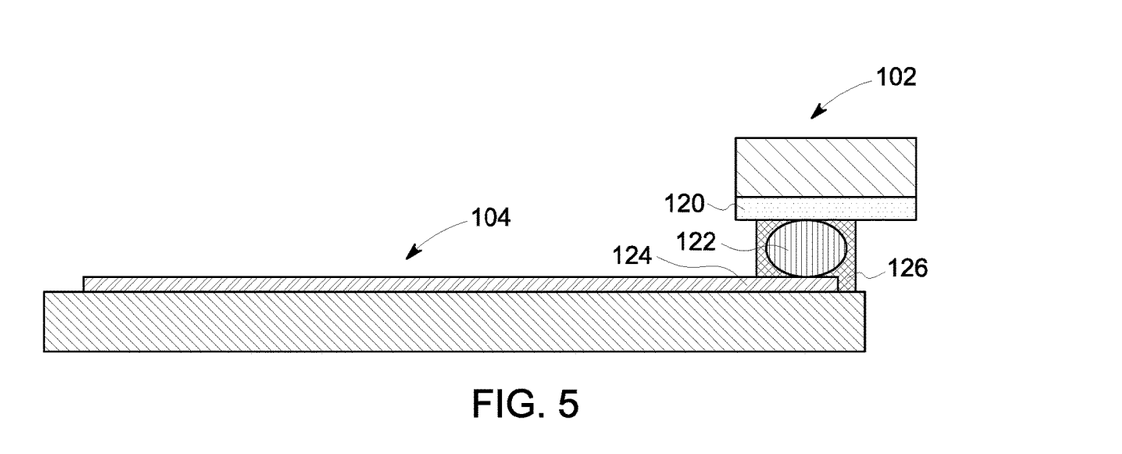
FIG. 5 is a schematic, sectional view of the sensor assembly and electronics board shown in FIG. 4.

FIG. 4 is a schematic, top view of a portion of an exemplary sensor assembly 102 and electronics board 104 for use in sensor system 100 shown in FIG. 1. FIG. 5 is a schematic, sectional view of sensor assembly 102 and electronics board 104 shown in FIG. 4. In the exemplary embodiment, sensor assembly 102 is substantially the same as sensor assembly 102 described above with respect to FIG. 3 other than, in the exemplary embodiment, sensor assembly 102 includes two remetalized bumps 122 formed on each bonding pad 120.

Referring to FIG. 4, in the exemplary embodiment, traces 124 of electronics board 104 include two traces 124 corresponding to the two bonding pads 120 of sensor assembly 102. In the exemplary embodiment, traces 124 are each formed of silver. In particular, traces 124 are formed by printing silver onto dielectric substrate 106 in an additive manufacturing process. In alternative embodiments, traces 124 are formed of any material that enables electronics board 104 to function as described herein. For example, and without limitation, in some alternative embodiments, traces 124 are etched from a blanket of copper deposited on dielectric substrate 106 (i.e., by a subtractive manufacturing process). In alternative embodiments, traces 124 include bumps, similar to remetalized bumps 122 on bonding pad 120 to facilitate electrically coupling sensor assembly 102 to electronics board 104.

In the exemplary embodiment, sensor assembly 102 is decoupled and spaced from electronics board 104. Sensor assembly 102 is configured to be coupled to electronics board 104 (e.g., as shown in FIG. 5) by flipping sensor assembly 102 (i.e., rotating sensor assembly 102 approximately 180 degrees from the illustrated orientation) and aligning bonding pads 120 with traces 124 such that bonding pads 120 and traces 124 are in a face-to-face orientation relative to one another. In particular, in the exemplary embodiment, bonding pads 120 are sized and spaced in correspondence with traces 124 to facilitate alignment of each bonding pad 120 with each respective trace 124 when sensor assembly 102 is coupled to electronics board 104.

In the exemplary embodiment, an adhesive 126 is applied on sensor assembly 102 prior to coupling sensor assembly 102 to electronics board 104. In the exemplary embodiment, adhesive 126 is a non-conductive adhesive. As used herein, the term "non-conductive adhesive" refers to an adhesive that does not include a sufficient density of conductive materials to permit electrical connection through adhesive 126 alone. For example, in the exemplary embodiment, adhesive 126 is an anisotropic conductive film having less than 20% by volume of conductive fillers. In alternative embodiments, adhesive 126 is any adhesive that enables sensor system 100, shown in FIG. 1 to function as described herein. For example, and without limitation, in some embodiments, adhesive 126 is an anisotropic conductive film or paste containing a filler material, such as one of solder, carbon, nickel, and gold particles. In further alternative embodiments, adhesive 126 is a non-conductive film, paste, or liquid that is capable of adhering trace 124 and remetalized bump 122 into contact.

In the exemplary embodiment, adhesive 126 is applied on remetalized bumps 122 and extends between a first side 128 and a second side 130 of sensor assembly 102. Referring to FIG. 5, when coupled, adhesive 126 is in contact with, and extends between, sensor assembly 102 and electronics board 104. More specifically, in the exemplary embodiment, adhesive 126 is in contact with, and extends between bonding pad 120 and trace 124. Referring back to FIG. 4, adhesive 126 allows for mechanical coupling between sensor assembly 102 and electronics board 104 along the entire length of a front edge 132 of sensor assembly 102 (e.g., between traces 124 when sensor assembly 102 is coupled to electronics board 104) while electrically coupling sensor assembly 102 and electronics board 104 at bonding pads 120 and traces 124. In alternative embodiments, adhesive 126 is applied along only a portion of front edge 132 of sensor assembly 102.

Figure 6:
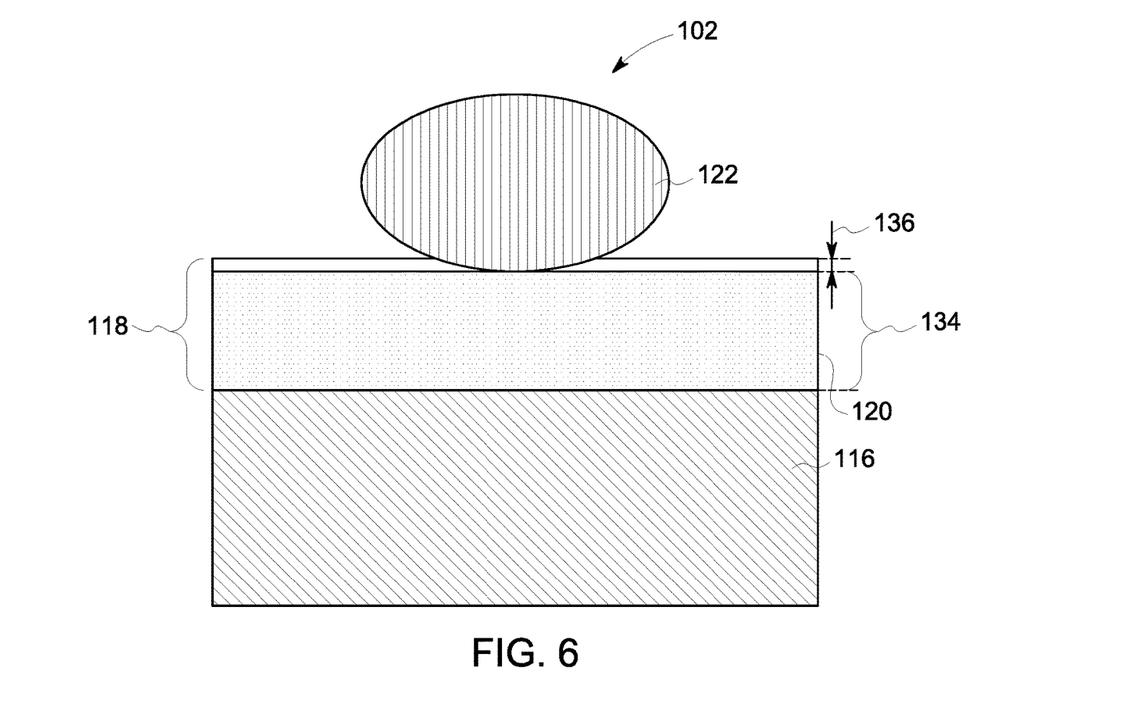
FIG. 6 is a schematic, enlarged view of a portion of the sensor assembly shown in FIG. 5.

FIG. 6 is a schematic, enlarged view of a portion of sensor assembly 102 shown in FIG. 5. In the exemplary embodiment, metalized layer 118, or more specifically, bonding pad 120, is formed on die substrate 116. Metalized layer 118 is formed of a first metal material 134 configured to facilitate operation of sensor assembly 102. More specifically, in the exemplary embodiment, first metal material 134 is formed of aluminum. In alternative embodiments, metalized layer 118 is formed of any material that enables sensor assembly 102 to function as described herein. In the exemplary embodiment, metalized layer 118 includes a thin oxidized surface layer 136 covering first metal material 134. For example, and without limitation, in the exemplary embodiment, oxidized surface layer 136 is formed of an aluminum oxide. First metal material 134 is substantially conductive and oxidized surface layer 136 is substantially non-conductive.

In the exemplary embodiment, remetalized bump 122 extends from first metal material 134 through and beyond oxidized surface layer 136. More specifically, remetalized bump 122 is, at least partially, in contact with first metal material 134 to facilitate current flow between remetalized bump 122 and first metal material 134 of metalized layer 118. During assembly of sensor assembly 102, remetalized bump 122 is formed on bonding pad 120 such that remetalized bump 122 penetrates oxidized surface layer 136 and contacts first metal material 134. In alternative embodiments, at least a portion of oxidized surface layer 136 is removed prior to forming remetalized bump 122 on bonding pad 120.

In the exemplary embodiment, remetalized bump 122 is formed of a second metal material. In the exemplary embodiment, the second metal material is gold. In alternative embodiments, the second metal material is any material that enables remetalized bump 122 to function as described herein. For example, and without limitation, in some alternative embodiments, the second metal material is formed, at least in part, of one of gold, copper, palladium, or platinum. In further alternative embodiments, remetalized bump 122 is formed of the same material as metalized layer 118. For example, in some alternative embodiments, remetalized bump 122 is formed of aluminum.

Referring back to FIG. 5, in the exemplary embodiment, the second metal material is compatible to interconnect with bonding pad 120 and trace 124. For example, and without limitation, in the exemplary embodiment, trace 124 is formed of silver and first metal material 134 is formed of aluminum. As a result, a direct connection between trace 124 and first metal material 134 is highly susceptible to galvanic corrosion from current flow. In the exemplary embodiment, the second metal material (e.g., gold, copper, palladium, platinum) has a low susceptibility to galvanic corrosion with first metal material 134 (e.g., aluminum) and trace 124 (e.g., silver). Moreover, in the exemplary embodiment, forming remetalized bump 122 of the second metal material allows for low contact resistance between remetalized bump 122 and first metal material 134, shown in FIG. 6.

Figure 7:
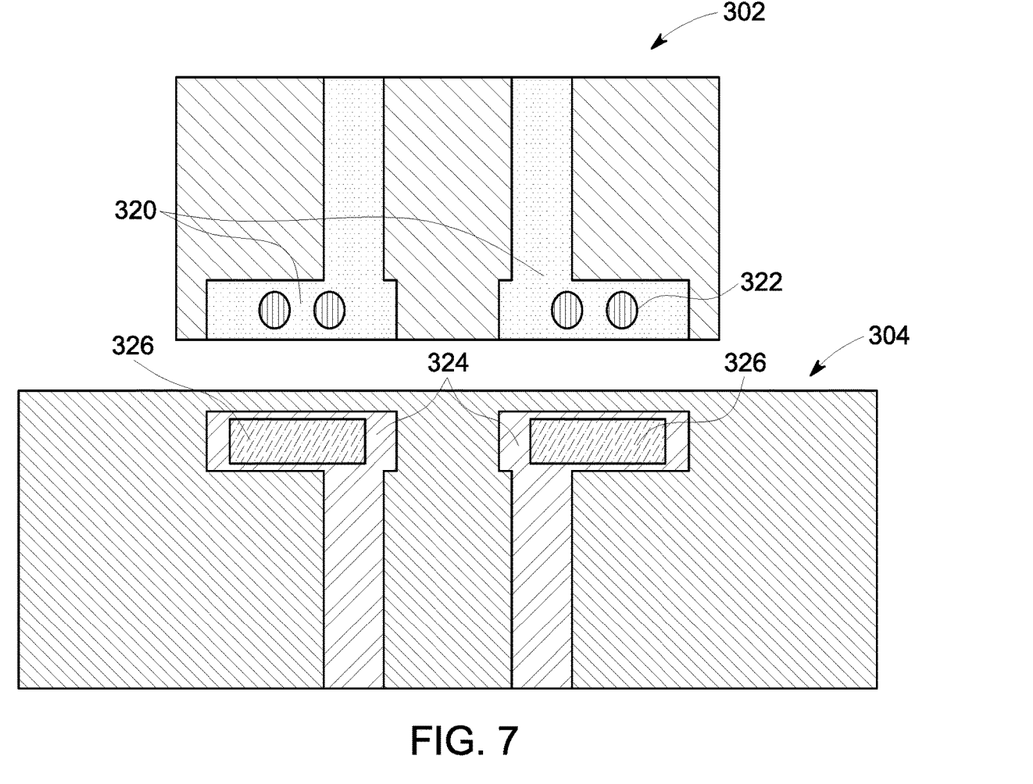
FIG. 7 is a schematic, top view of an alternative sensor assembly and electronics board for use in the sensor system shown in FIG. 1.
Figure 8:
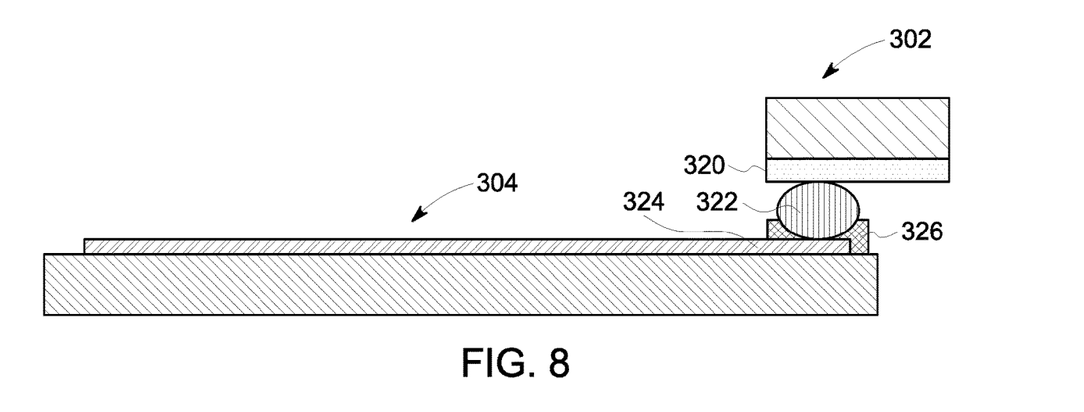
FIG. 8 is a schematic, sectional view of the sensor assembly and electronics board shown in FIG. 7.

FIG. 7 is a schematic, top view of an alternative sensor assembly 302 and electronics board 304 for use in sensor system 100 shown in FIG. 1. FIG. 8 is a schematic, sectional view of sensor assembly 302 and electronics board 304 shown in FIG. 7. In the exemplary embodiment, sensor assembly 302 and electronics board 304 are substantially the same as sensor assembly 102 and electronics board 104 described above with respect to FIGS. 1-6, except as described below.

Referring to FIG. 7, in the exemplary embodiment, an adhesive 326 is applied on electronics board 304 prior to coupling sensor assembly 302 to electronics board 304. In the exemplary embodiment, adhesive 326 is a conductive adhesive. In other words, in the exemplary embodiment, conductive fillers, such as, for example, and without limitation, silver, nickel, copper, or graphite account for at least 20% of the volume of adhesive 326. More specifically, in the exemplary embodiment, adhesive includes between 40-95% conductive fillers by volume.

In the exemplary embodiment, prior to coupling sensor assembly 302 to electronics board 304, adhesive 326 is applied on each trace 324 on electronics board 304. Adhesive 326 allows for mechanical coupling between sensor assembly 302 and electronics board 304 at bonding pads 320 of sensor assembly 302 and traces 324 of electronics board 304 while electrically coupling sensor assembly 302 and electronics board 304 at bonding pads 320 and traces 324. Referring to FIG. 8, when coupled, adhesive 326 is in contact with, and extends between, electronics board 304 and remetalized bump 322 but does not contact bonding pad 320. At least in part due to adhesive 326 being out of contact with bonding pad 320 during operation, current flow between sensor assembly 302 and electronics board 304 is directed through remetalized bump 322. In alternative embodiments, adhesive 326 is applied in any manner that enables sensor system 300 to function as described herein.

Figure 9:
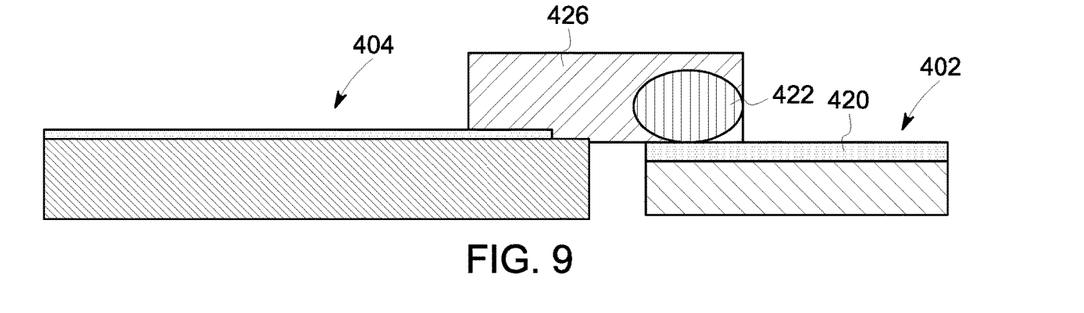
FIG. 9 is a schematic, sectional view of another alternative sensor assembly and electronics board for use in the sensor system shown in FIG. 1.

FIG. 9 is a schematic, sectional view of another alternative sensor assembly 402 and electronics board 404 for use in sensor system 100 shown in FIG. 1. In the exemplary embodiment, sensor assembly 402 and electronics board 404 are substantially the same as sensor assembly 302 and electronics board 304 described above with respect to FIGS. 7 and 8, except as described below.

In the exemplary embodiment, electronics board 404 and sensor assembly 402 are mechanically coupled together using an adhesive 426. More specifically, in the exemplary embodiment, adhesive 426 is a conductive adhesive similar to adhesive 326, described above with respect to FIGS. 7 and 8. In the exemplary embodiment, sensor assembly 402 is coupled to electronics board 404 by positioning bonding pads 420 adjacent to traces 424 and applying an adhesive to extend transversely between traces 424 and bonding pad 420 to surround remetalized bump 422. In other words, unlike the embodiments described above with respect to FIGS. 1-8, in the exemplary embodiment, it is not necessary to orient traces 424 and bonding pads 420 to be in a face-to-face relationship when coupled.

FIG. 10 is a flow diagram of an exemplary production method for assembling an alternative sensor system 500. In the exemplary embodiment, sensor system 500 includes an electronics board 504 including a dielectric substrate 506. Dielectric substrate 506 extends between a top face 540, or more broadly, a first face, and a bottom face 542, or more broadly a second face, opposite top face 540. Dielectric substrate 506 defines an aperture 544 extending between top face 540 and bottom face 542. In particular, during production, aperture 544 is cut from dielectric substrate 506 such that aperture 544 is sized to receive a lid 514 of sensor assembly 502 therethrough.

In the exemplary embodiment, electronics board 504 includes traces 524 on bottom face 542 of dielectric substrate 506. Bonding pads 520 of sensor assembly 502 have remetalized bumps 522 formed thereon and configured to contact traces 524 when sensor assembly 502 is coupled to electronics board 504. During assembly, prior to bonding sensor assembly 502 to electronics board 504, remetalized bumps 522 are applied to bonding pads 520 and sensor assembly 502 is singulated from wafer assembly 112, shown in FIG. 2. In alternative embodiments, sensor assembly 502 is bonded to electronics board 504 prior to singulation. An adhesive (not shown) similar to adhesive 126, shown in FIGS. 4-6 or adhesive 326 shown in FIGS. 7-9 is applied to at least one of sensor assembly 502 and electronics board 504. More specifically, in the exemplary embodiment, a non-conductive adhesive (similar to adhesive 126, shown in FIGS. 4-6) is applied around the perimeter of die substrate 516 of sensor assembly 502.

In the exemplary embodiment, aperture 544 acts as an alignment guide to facilitate high speed alignment and attachment of remetalized bumps 522 with traces 524. More specifically, in the exemplary embodiment, to align remetalized bumps 522 with traces 524, sensor assembly 502 is flipped (i.e., rotated 180 degrees) such that bonding pads 520 are oriented in a face-to-face relationship with traces 524 and such that lid 514 is aligned with aperture 544. Traces 524 are positioned on dielectric substrate 506 such that aligning lid 514 with aperture 544 also aligns traces 524 with bonding pads 520. Sensor assembly 502 is then coupled to electronics board 504 with lid 514 extending through aperture 544 to top face 540 of dielectric substrate 506 and remetalized bumps 522 in contact with traces 524 on bottom face 542 of dielectric substrate. In the exemplary embodiment, sensor assembly 502 is bonded to electronics board 504 by a roll-to-roll manufacturing process. In alternative embodiment, sensor assembly 502 is bonded to electronics board by any process that enables sensor system 500 to function as described herein.

Figure 11:
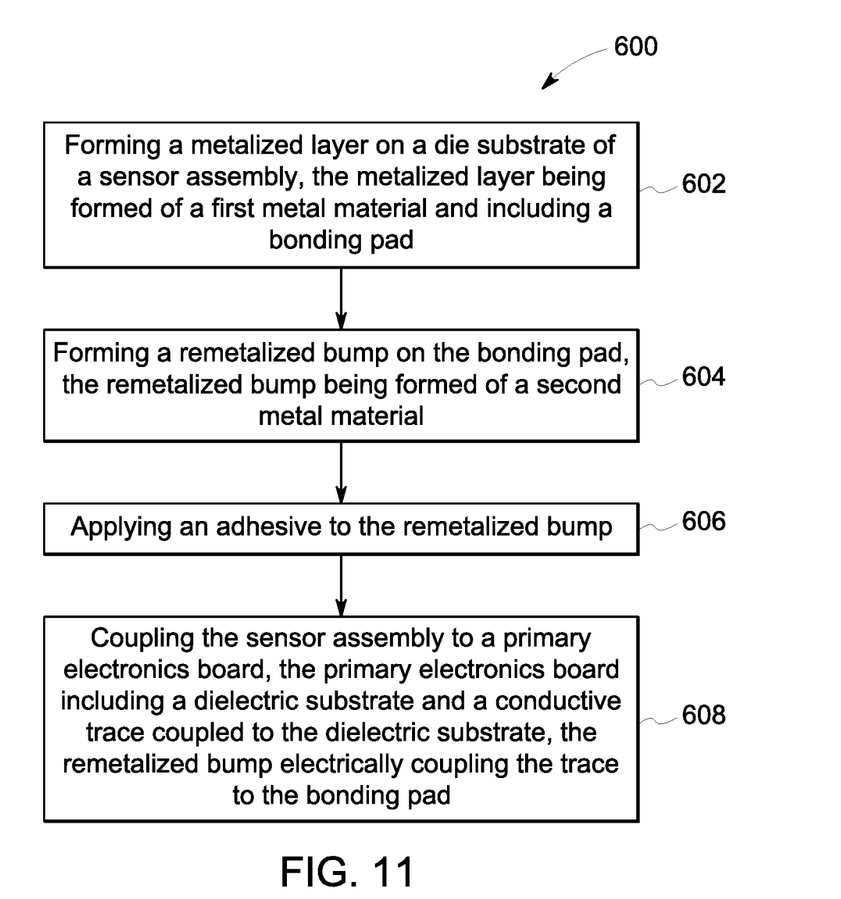
FIG. 11 is a flow diagram of an exemplary method of assembling the sensor system shown in FIG. 1.

FIG. 11 is a flow diagram of an exemplary method 600 of assembling a sensor system (e.g., sensor system 100 shown in FIG. 1). Method 600 includes forming 602 a metalized layer (e.g., metalized layer 118 shown in FIG. 6) on a die substrate (e.g., die substrate 116 shown in FIG. 6) of a sensor assembly (e.g., sensor assembly 102 shown in FIG. 3), the metalized layer being formed of a first metal material (e.g., first metal material 134 shown in FIG. 6) and including a bonding pad (e.g., bonding pad 120 shown in FIG. 3). Method 600 further includes forming 604 a remetalized bump (e.g., remetalized bump 122 shown in FIG. 3) on the bonding pad, the remetalized bump being formed of a second metal material. Method 600 further includes applying 606 an adhesive (e.g., adhesive 126 shown in FIG. 4) to the remetalized bump. Method 600 also includes coupling 608 the sensor assembly to an electronics board, the electronics board including a dielectric substrate (e.g., dielectric substrate 106 shown in FIG. 4) and a trace (e.g., trace 124 shown in FIG. 4) coupled to the dielectric substrate, the remetalized bump electrically coupling the trace to the bonding pad.

An exemplary technical effect of the methods, systems, and apparatus described herein includes at least one of: (a) improved strength in mechanical coupling between sensor assemblies and electronics boards; (b) reduced spatial requirements for interconnects of sensor assemblies and electronics boards; (c) improved lifespan of sensor assemblies; (d) reduced assembly time required for bonding sensor assemblies and electronics boards; and (e) reduced inductance interconnects.

Exemplary embodiments of antenna arrays, antenna systems, and methods for assembling antenna arrays, are described above in detail. The methods and systems are not limited to the specific embodiments described herein, but rather, components of systems and/or steps of the methods may be utilized independently and separately from other components and/or steps described herein. For example, the method may also be used in combination with other antenna arrays and/or antenna systems, and are not limited to practice only with the antenna arrays and antenna systems as described herein. Rather, the exemplary embodiment can be implemented and utilized in connection with many other antenna system applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A sensor assembly comprising:
   a die substrate;
   a metalized layer formed on said die substrate, said metalized layer formed of a first metal material and comprising a bonding pad to facilitate electrically coupling said sensor assembly to a sensor system;
   a remetalized bump formed on said bonding pad, said remetalized bump formed of a second metal material and electrically coupled to said metalized layer; and
   an adhesive applied to said remetalized bump, wherein said adhesive facilitates mechanically coupling said sensor assembly to the sensor system.

2. The sensor assembly of claim 1, wherein said adhesive comprises at least one of a non-conductive adhesive and an anisotropic conductive adhesive layer, said adhesive formed of at least one of a film, a liquid, and a paste.

3. The sensor assembly of claim 1, wherein said adhesive comprises a conductive adhesive.

4. The sensor assembly of claim 1 further comprising a lid coupled to said die substrate, said lid substantially covering said die substrate and exposing said bonding pad.

5. The sensor assembly of claim 1, wherein said metalized layer comprises an oxidized surface layer covering the first metal material, and wherein said remetalized bump extends from the first metal material through the oxidized surface layer.

6. The sensor assembly of claim 1, wherein the first metal material is aluminum, and wherein the second metal material is at least one of aluminum, gold, copper, palladium, and platinum.

7. The sensor assembly of claim 1, wherein said die substrate comprises a piezoelectric material.

8. The sensor assembly of claim 1, wherein said die substrate and said metalized layer form a surface acoustic wave (SAW) device.

9. A sensor system comprising:
   an electronics board comprising a dielectric substrate and a conductive trace coupled to said dielectric substrate; and
   a sensor assembly coupled to said electronics board, said sensor assembly comprising:
   a die substrate;
   a metalized layer formed on said die substrate of a first metal material, said metalized layer comprising a bonding pad to facilitate electrically coupling said sensor assembly to said trace;
   a remetalized bump formed on said bonding pad of a second metal material, said remetalized bump electrically coupling said bonding pad to said trace; and
   an adhesive applied to said remetalized bump, wherein said adhesive facilitates mechanically coupling said sensor assembly to said electronics board.

10. The sensor system of claim 9, wherein said adhesive comprises at least one of a non-conductive adhesive and an anisotropic conductive adhesive layer, said adhesive formed of at least one of a film, a liquid, and a paste.

11. The sensor system of claim 9, wherein said adhesive comprises a conductive adhesive.

12. The sensor system of claim 9 further comprising an additional remetalized bump formed on said conductive trace, said additional remetalized bump configured to facilitate electrically coupling said bonding pad to said trace.

13. The sensor system of claim 9 further comprising a lid coupled to said die substrate, said lid substantially covering said die substrate and exposing said bonding pad, wherein said dielectric substrate comprises a first face and a second face opposite said first face, said dielectric substrate defining an aperture extending between said first face and said second face.

14. The sensor system of claim 13, wherein the aperture is sized to receive said lid therethrough, wherein said trace is positioned on said second face of said dielectric substrate.

15. The sensor system of claim 14, wherein said bonding pad is positioned on said die substrate to be in a face-to-face relationship with and aligned with said trace when said lid is received within the aperture.

16. The sensor system of claim 9, wherein said metalized layer comprises an oxidized surface layer covering the first metal material, and wherein said remetalized bump extends from the first metal material through the oxidized surface layer.

17. A method of assembling a sensor system, said method comprising:
- forming a metalized layer on a die substrate of a sensor assembly, the metalized layer being formed of a first metal material and including a bonding pad;
- forming a remetalized bump on the bonding pad, the remetalized bump being formed of a second metal material;
- applying an adhesive to the remetalized bump; and
- coupling the sensor assembly to an electronics board, the electronics board including a dielectric substrate and a conductive trace coupled to the dielectric substrate, the remetalized bump electrically coupling the trace to the bonding pad.

18. The method of claim 17 further comprising aligning, prior to said coupling, a lid of the sensor assembly with an aperture defined in the dielectric substrate, wherein said aligning comprises flipping the sensor assembly such that the bonding pad aligns with and is oriented in a face-to-face relationship with the trace.

19. The method of claim 17, wherein the metalized layer includes an oxidized surface layer covering the first metal material, wherein said forming a remetalized bump on the bonding pad further comprises removing at least a portion of the oxidized surface layer and forming the remetalized bump in direct contact with the first metal material.

20. The method of claim 17 further comprising singulating, after coupling the sensor assembly, the die substrate from a wafer assembly, the wafer assembly including a plurality of sensor assemblies.

\* \* \* \* \*